(12) United States Patent
Pandita et al.

(10) Patent No.: US 10,355,701 B2
(45) Date of Patent: Jul. 16, 2019

(54) APPARATUS AND METHOD FOR FREQUENCY CALIBRATION OF VOLTAGE CONTROLLED OSCILLATOR (VCO) INCLUDING DETERMINING VCO FREQUENCY RANGE

(71) Applicant: QUALCOMM Incorporated, San Diego, CA (US)

(72) Inventors: Bupesh Pandita, Raleigh, NC (US); Eskinder Hailu, Cary, NC (US); Zhuo Gao, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/675,160

(22) Filed: Aug. 11, 2017

(65) Prior Publication Data
US 2019/0052278 A1    Feb. 14, 2019

(51) Int. Cl.
| | |
|---|---|
| *H03L 7/089* | (2006.01) |
| *H03L 7/087* | (2006.01) |
| *H03L 7/099* | (2006.01) |
| *H03L 7/095* | (2006.01) |
| *H03B 5/12* | (2006.01) |
| *G06F 1/10* | (2006.01) |
| *H03K 3/03* | (2006.01) |

(52) U.S. Cl.
CPC .............. *H03L 7/089* (2013.01); *G06F 1/10* (2013.01); *H03B 5/1215* (2013.01); *H03B 5/1253* (2013.01); *H03K 3/0315* (2013.01); *H03L 7/087* (2013.01); *H03L 7/095* (2013.01); *H03L 7/099* (2013.01)

(58) Field of Classification Search
CPC .... G06F 1/00; G06F 1/10; H03B 5/00; H03B 5/1215; H03B 5/1253; H03L 7/00; H03L 7/087; H03L 7/089; H03L 7/0891; H03L 7/093; H03L 7/095; H03L 7/099; H03L 7/10; H03L 7/18
USPC ......................................................... 327/156
See application file for complete search history.

(56) References Cited

U.S. PATENT DOCUMENTS

| | | |
|---|---|---|
| 7,298,790 B2 | 11/2007 | Craninckx |
| 7,522,690 B2 | 4/2009 | Zhang |
| 8,111,092 B2 | 2/2012 | Rombach et al. |
| 8,134,393 B1 | 3/2012 | Nagaraj et al. |

(Continued)

*Primary Examiner* — Lincoln D Donovan
*Assistant Examiner* — Dave Mattison
(74) *Attorney, Agent, or Firm* — Loza & Loza, LLP/Qualcomm

(57) ABSTRACT

A phase lock loop (PLL) circuit includes a selection mode device before a phase detector and time-to-digital converter (TDC). In a first mode, the selection mode device outputs two signals having consecutive rising edges that are spaced apart in time by substantially one period of the reference clock signal. In a second mode, the selection mode device outputs two signals having consecutive rising edges that are spaced apart in time by substantially one period of the feedback clock signal. In a third mode, the selection mode device outputs the reference and feedback clock signals. The phase detector and TDC are configured to generate a signal: indicating the reference clock frequency in the first mode; indicating of the feedback clock frequency in the second mode; and indicating a phase/frequency difference between the feedback and reference clocks in the third mode. These signals are used to control a VCO clock signal.

27 Claims, 6 Drawing Sheets

(56) References Cited

U.S. PATENT DOCUMENTS

| | | | |
|---|---|---|---|
| 8,222,933 B2 | 7/2012 | Nagaraj et al. | |
| 8,461,886 B1 * | 6/2013 | Yao | H03L 7/089 327/147 |
| 9,432,025 B1 * | 8/2016 | Khor | H03L 1/00 |
| 2009/0251225 A1 * | 10/2009 | Chen | H03K 3/03 331/1 A |
| 2012/0074996 A1 * | 3/2012 | Nagaraj | H03L 7/083 327/157 |
| 2014/0084974 A1 * | 3/2014 | Tang | H03L 7/0891 327/154 |

* cited by examiner

APPARATUS AND METHOD FOR FREQUENCY CALIBRATION OF VOLTAGE CONTROLLED OSCILLATOR (VCO) INCLUDING DETERMINING VCO FREQUENCY RANGE

FIELD

Aspects of the present disclosure relate generally to phase lock loops (PLLs), and in particular, to an apparatus and method for frequency calibration of a voltage controlled oscillator (VCO) including determining the VCO's frequency tunable range.

BACKGROUND

A phase lock loop (PLL) circuit is configured to generate an output clock signal that is frequency and phase locked with an input reference clock signal. A PLL circuit typically includes a phase detector for generating a signal indicative of a phase difference between a feedback clock signal and the reference clock signal, a phase/frequency error signal generating device, a voltage controlled oscillator (VCO) for generating the output clock signal based on the phase/frequency error signal, and a frequency divider for generating the feedback clock signal by frequency dividing the output clock signal. Through negative feedback operation, the phase/frequency error signal forces the VCO to generate the output or VCO clock signal to be phase and frequency locked with the reference clock signal.

The PLL circuit may further include a calibration circuit for setting an initial frequency for the output clock signal generated by the VCO prior to the phase/frequency control of the output clock signal as discussed above. In the past, the calibration circuit included substantial electronics for setting the initial frequency of the VCO clock signal. Such additional calibration electronics typically consumes substantial power, requires substantial integrated circuit (IC) footprint to implement, and requires a relatively long calibration procedure to set the initial frequency of the VCO clock signal.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a selection mode device configured to output first and second signals in a first mode, wherein consecutive edges of the first and second signals, respectively, are spaced apart in time by substantially a period of a reference clock signal, output third and fourth signals in a second mode, wherein consecutive edges of the third and fourth signals, respectively, are spaced apart in time by substantially a period of a feedback clock signal, and output the reference clock signal and the feedback clock signal in a third mode signal; and a phase lock loop (PLL) circuit configured to generate a voltage controlled oscillator (VCO) clock signal based on the first, second, third, and fourth signals, and the reference and feedback clock signals.

Another aspect of the disclosure relates to a method including outputting first and second signals in a first mode, wherein consecutive edges of the first and second signals, respectively, are spaced apart in time by substantially a period of a reference clock signal; outputting third and fourth signals in a second mode, wherein consecutive edges of the third and fourth signals, respectively, are spaced apart in time by substantially a period of a feedback clock signal; outputting the reference clock signal and the feedback clock signal in a third mode; and generating a voltage controlled oscillator (VCO) clock signal based on the first, second, third, and fourth signals, and the reference and feedback clock signals.

Another aspect of the disclosure relates to apparatus including means for outputting first and second signals in a first mode, wherein consecutive edges of the first and second signals, respectively, are spaced apart in time by substantially a period of a reference clock signal; means for outputting third and fourth signals in a second mode, wherein consecutive edges of the third and fourth signals, respectively, are spaced apart in time by substantially a period of a feedback clock signal; means for outputting the reference clock signal and the feedback clock signal in a third mode; and means for generating a voltage controlled oscillator (VCO) clock signal based on the first, second, third, and fourth signals, and the reference and feedback clock signals.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
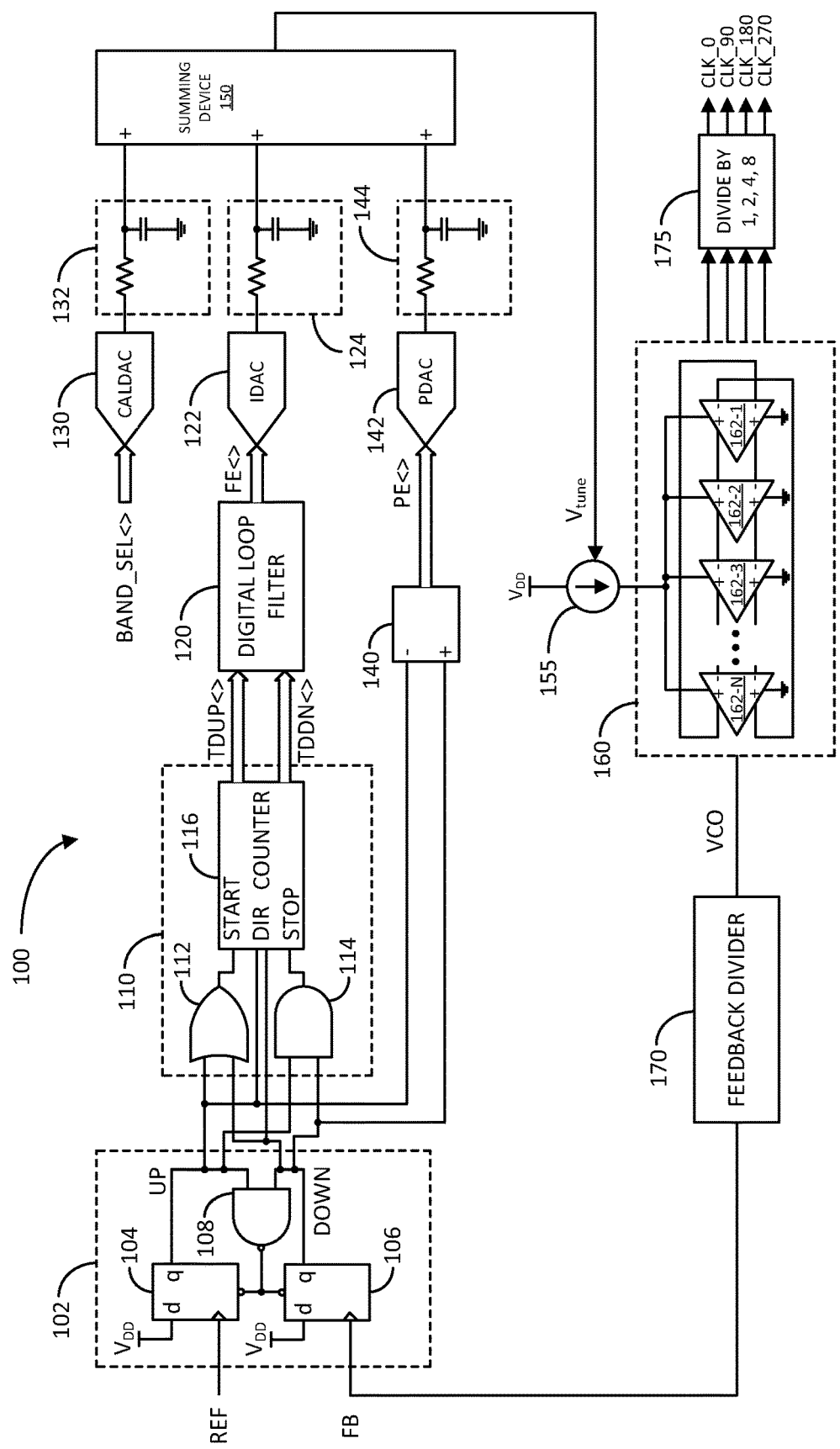
FIG. 1 illustrates a block diagram of an exemplary phase lock loop (PLL) in accordance with an aspect of the disclosure.

FIG. 1 illustrates a block diagram of an exemplary phase lock loop (PLL) 100 in accordance with an aspect of the disclosure. The PLL 100 includes a phase detector 102 (sometimes also referred to as a phase-frequency detector (PFD)), a time-to-digital converter (TDC) 110, a digital loop filter 120, an "integrator" digital analog converter (IDAC) 122, an "integrator" analog low pass filter (LPF) 124, a "calibration" DAC (CALDAC) 130, a "calibration" LPF 132, a differential device 140, a "proportional" DAC (PDAC) 142, a "proportional" LPF 144, and an analog summing device 150.

The PLL 100 further includes a controllable current source 155, a ring oscillator 160, and a feedback divider 170. Additionally, the PLL 100 may include a frequency divider bank 175 for generating a set of different frequency clock signals.

The phase detector 102, in turn, includes a first flip-flop 104, a second flip-flop 106, and a NAND gate 108. The first flip-flop 104 includes a data input (d) configured to receive a supply voltage $V_{DD}$ (essentially a high logic voltage), an output (q) coupled to a first input of the NAND gate 108, and a clock input configured to receive a reference clock signal (REF). The second flip-flop 106 includes a data input (d) configured to receive the supply voltage $V_{DD}$, an output (q) coupled to a second input of the NAND gate 108, and a clock input configured to receive a feedback clock signal (FB) from the feedback divider 170. The NAND gate 108 includes an output coupled to complementary reset inputs of the first and second flip-flops 104 and 106.

The phase detector 102 generates UP and DOWN control signals depending on the times of arrival of rising edges of the reference clock signal (REF) and the feedback clock signal (FB). In particular, the phase detector 102 asserts the UP control signal (e.g., sets it to a high logic voltage) at the output (q) of the first flip-flop 104 and keeps the DOWN control signal deasserted (e.g., set to a low logic voltage) at the output (q) of the second flip-flop 106, if a rising edge of the reference clock signal (REF) arrives before a rising edge of the feedback clock signal (FB) after the NAND gate 108 has reset the flip-flops 104 and 106. The UP signal remains asserted and the DOWN signal remains deasserted during a time interval between the arrival of the rising edge of the reference clock signal (REF) and the arrival of the rising edge of the feedback clock signal (FB).

Similarly, the phase detector 102 asserts the DOWN control signal (e.g., sets it to a high logic voltage) at the output (q) of the second flip-flop 106 and keeps the UP control signal deasserted (e.g., set to a low logic voltage) at the output (q) of the first flip-flop 104, if a rising edge of the feedback clock signal (FB) arrives before a rising edge of the reference clock signal (REF) after the NAND gate 108 has reset the flip-flops 104 and 106. The UP signal remains asserted and the DOWN signal remains deasserted during a time interval between the arrival of the rising edge of the feedback clock signal (FB) and the arrival of the rising edge of the reference clock signal (REF).

In more detail, the NAND gate 108 generates a low logic voltage when both the UP and DOWN signals become asserted (e.g., high logic voltages) indicating a completion of a previous phase comparison cycle. The low logic voltage generated by the NAND gate 106 resets the first and second flip-flops 104 and 106; causing them to generate deasserted UP and DOWN signals (e.g., low logic voltages). In response to the deasserted UP and DOWN signals, the NAND gate 106 generates a high logic voltage to disable the resetting of the flip-flops 104 and 106 and allowing them to generate the UP and DOWN signals based on the times of arrival of the rising edges of the reference clock signal (REF) and the feedback clock signal (FB), respectively.

If the rising edge of the reference clock signal (REF) arrives first, the first flip-flop 104 asserts the UP signal. When the rising edge of the feedback clock signal (FB) subsequently arrives, the DOWN signal is asserted; causing the NAND gate 108 to reset the flip-flops 104 and 106 as discussed. If the rising edge of the feedback clock signal (FB) arrives first, the first flip-flop 106 asserts the DOWN signal. When the rising edge of the reference clock signal (REF) subsequently arrives, the UP signal is asserted; causing the NAND gate 108 to reset the flip-flops 104 and 106 as discussed.

The TDC 110 generates a TDUP< > signal (e.g., a 14-bit signal TUP<13:0>), whose magnitude is indicative of a time interval between a time of arrival of a rising edge of the reference clock signal (REF) and the time of arrival of a rising edge of the feedback clock signal (FB). Similarly, the TDC 110 generates a TDDN< > signal (e.g., a 14-bit signal TDDN<13:0>), whose magnitude is indicative of a time interval between a time of arrival of a rising edge of the feedback clock signal (FB) and the time of arrival of a rising edge of the reference clock signal (REF).

In particular, the TDC 110 includes an OR gate 112, an AND gate 114, and a counter 116. The OR gate 112 includes inputs configured to receive the UP and DOWN signals from the phase detector 102, respectively. The AND gate 114 also includes inputs configured to receive the UP and DOWN signals from the phase detector 102, respectively. The output of the OR gate 112 is coupled to START input of the counter 116. The output of the AND gate 114 is coupled to a STOP input of the counter 116. The UP and DOWN signals are also applied to DIRECTION (DIR) inputs of the counter 116.

The TDC 110 operates as follows: The OR gate 112 generates an asserted output (e.g., a high logic voltage) in response to either an asserted UP signal or an asserted DOWN signal generated by the phase detector 102. In response to the asserted output generated by the OR gate 112, the counter 116 initializes the TDUP< > and TDDN< > signals to zero (0), and periodically increments one of the TDUP< > or TDDN< > signal based on a clock signal (not shown). For example, if the UP signal is asserted before the DOWN signal, the counter 116 periodically increments the initialized TDUP< > signal. If the DOWN signal is asserted before the UP signal, the counter 116 periodically increments the initialized TDDN< > signal.

When the non-asserted UP or DOWN signal subsequently becomes asserted, the AND gate 114 generates an asserted output (e.g., a high logic voltage), which causes the counter 116 to stop incrementing the TDUP< > or TDDN< > signal. The resulting value of the TDUP< > or TDDN< > signal indicates the phase difference or time interval between consecutive rising edges of the reference clock signal (REF) and the feedback clock signal (FB), respectively.

The digital loop filter 120 integrates the difference between the TDUP< > and TDDN< > signals over a defined time constant to generate a digital frequency error signal FE< >. The digital frequency error signal FE< > is converted into an analog frequency error signal by the IDAC 122. The analog frequency error signal is then low pass filtered by the analog LPF 124 to remove high frequency replicas. The filtered analog frequency error signal is then applied to an input of the analog summing device 150.

The UP and DN signals generated by phase detector 102 are also applied to positive and negative inputs of the differential device 140, respectively. The differential device 140 generates a digital phase error signal PE< > based on a difference between the UP and DOWN signals. The PDAC 142 converts the digital phase error signal PE< > into an analog phase error signal. The analog phase error signal is then low pass filtered by the analog LPF 144 to remove high frequency replicas. The filtered analog phase error signal is then applied to another input of the analog summing device 150.

The CALDAC 130 receives a coarse frequency adjustment signal BAND_SEL< > (e.g., an 8-bit signal BAND_SEL<7:0>) for setting an initial frequency for a VCO clock signal generated by the ring oscillator 160. The CALDAC 130 converts the BAND_SEL< > into an analog coarse frequency adjustment signal. The analog coarse frequency adjustment signal is then low pass filtered by the analog LPF 132 to remove high frequency replicas. The filtered analog coarse frequency adjustment signal is then applied to yet another input of the analog summing device 150.

The analog summing device 150 generates a frequency control signal ($V_{tune}$) based on a summation of the analog signals produced at the outputs of the LPFs 132, 124, and 144. The frequency control signal $V_{tune}$ is applied to the controllable current source 155, which generates a current as a function of the frequency control signal $V_{tune}$. The current generated by the controllable current source 160 is applied to the ring oscillator 160.

The ring oscillator 160 generates the VCO clock signal with a frequency that is a function of the current generated by the controllable current source 155; the current being a function of the frequency control signal $V_{tune}$ generated by the analog summing device 150. As an example, if the frequency control signal $V_{tune}$ increases in magnitude, the current generated by the controllable current source 155 increases in magnitude, and the frequency of the VCO clock signal generated by the ring oscillator 160 increases. Similarly, if the frequency control signal $V_{tune}$ decreases in magnitude, the current generated by the controllable current source 155 decreases in magnitude, and the frequency of the VCO clock signal generated by the ring oscillator 160 decreases.

The ring oscillator 160 includes a set of cascaded inverters 162-1 to 162-N, where N is an odd integer. Each of the inverters 162-2 to 162-N (which the exception of the first inverter 162-1) includes positive and negative differential inputs coupled to negative and positive differential outputs of the previous cascaded inverter of the set, respectively. The first inverter 162-1 includes positive and negative differential inputs coupled to negative and positive differential outputs of the last inverter 162-N, respectively. Although the inverters 162-1 to 162-N are exemplified as differential inverters, it shall be understood that the inverters may alternatively be single-ended inverters.

The inverters 162-1 to 162-N are coupled between an upper voltage rail and a lower voltage rail (e.g., ground). The current generated by the controllable current source 155 is applied to the upper voltage rail. The injected current into the inverters 162-1 to 162-N reduces the signal delay of each of the inverters 162-1 and 162-N. As such, the frequency of the VCO clock signal generated by the ring oscillator 160 varies in the same direction (e.g., proportional) to the current generated by the controllable current source 155.

The feedback divider 170 divides the frequency of the VCO clock signal generated by the ring oscillator 160 to generate the feedback clock signal (FB). As discussed, the feedback clock signal (FB) is applied to an input of the phase detector 102 for performing the phase comparison with the reference clock signal (REF) as previously discussed.

The frequency divider bank 175 may tap into various nodes of the ring oscillator 165 to effectively receive several instantiations of the VCO clock signal, and divide these signals by a set of division factors (e.g., divide by 1, 2, 4, and 8) to generate a set of clock signals Clk_0, Clk_90, Clk_180, and Clk_270 for various operations.

In operation, during calibration, the BAND_SEL< > signal is adjusted to set the frequency of the VCO clock signal close to a target frequency based on the resolution of the BAND_SEL< > signal. As an example, if the target frequency is 5 GHz, the contribution of the BAND_SEL< > signal alone may cause the frequency of the VCO clock signal to be around 4.8 GHz.

The phase detector 102 with a digital integration path including the TDC 110, digital loop filter 120, IDAC 122, and LPF 124 perform finer frequency adjustments of the VCO clock frequency to bring the VCO frequency closer to the target frequency, which in this case is approximately the frequency of the REF clock signal multiplied by the divisor of the feedback divider 170.

The phase detector 102 with an analog proportional path including the differential device 140, PDAC 142, and LPF 144 perform fine phase adjustments of the VCO clock signal to phase lock the phase of the feedback clock signal (FB) with the phase of the reference clock signal (REF).

In some PLL architecture, the generation of the calibration signal BAND_SEL< > signal involved substantial electronics, which consume significant power, require substantial IC footprint to implement, and long calibration procedure. A couple of examples are discussed below.

Figure 2:
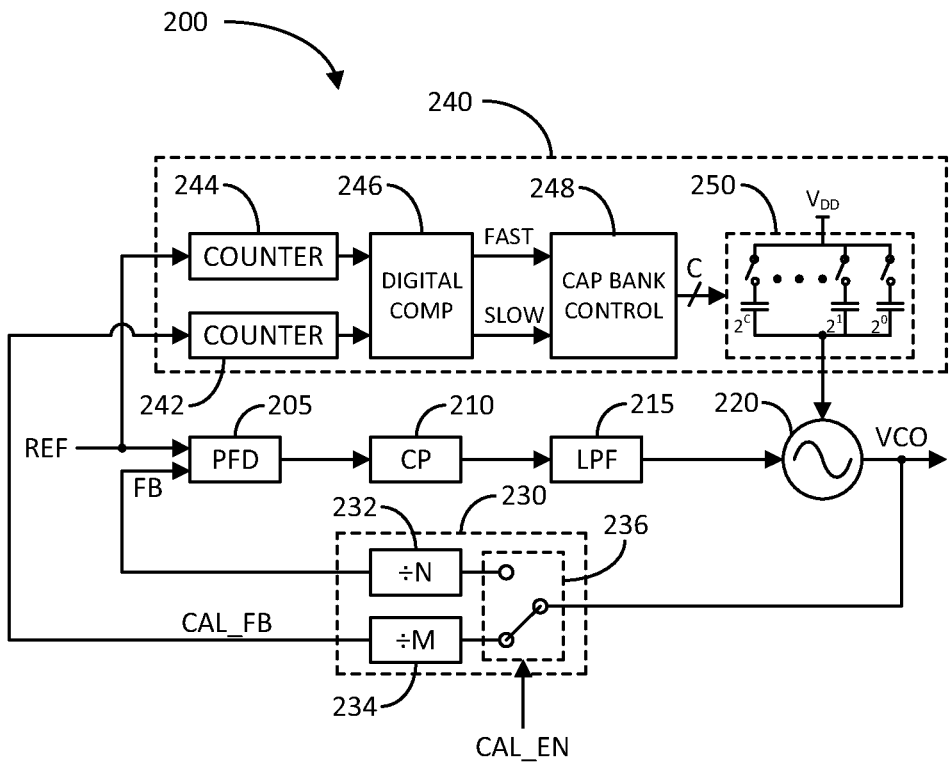
FIG. 2 illustrates a block diagram of another exemplary phase lock loop (PLL) in accordance with another aspect of the disclosure.

FIG. 2A illustrates a block diagram of another PLL 200 in accordance with another aspect of the disclosure. In this example, that PLL 200 includes circuitry for generating a coarse frequency calibration signal, similar to the frequency calibration signal BAND_SEL< >.

In particular, the PLL 200 includes a phase/frequency control loop including a phase-frequency detector (PFD) 205, a charge pump (CP) 210, a LPF 215, a VCO 220, and a feedback divider 230. The frequency divider 230, in turn, includes a divide-by-N divider 232, a divide-by-M divider 234, and a single-pole-double-throw (SPDT) switch 236. Further, the PLL 200 includes a frequency calibration circuit 240 including counters 242 and 244, digital comparator 246, capacitor bank control logic 248, and capacitor bank 250.

The PFD 205 includes a pair of inputs configured to receive a reference clock signal (REF) and a feedback clock signal FB, and an output configured to produce a signal indicative of a phase error between the reference clock signal (REF) and the feedback clock signal (FB). The CP 210 is configured to generate charge based on the phase error signal generated by the PFD 205. The LPF 215 is configured to integrate the charges generated by the CP 210 to generate a frequency control signal for the VCO 220. The VCO 220 generates a VCO clock signal based in part on the frequency control signal produced by the LPF 215.

The VCO clock signal is applied to the frequency divider 230; and in particular, to the pole of the SPDT switch 236. The SPDT 236 is responsive to a calibration enable (CAL_EN) signal. If the CAL_EN signal is deasserted (meaning that the PLL 200 is in operational mode), the SPDT 236 routes the VCO clock signal to the divide-by-N counter 232. The divide-by-N counter 232 divides the frequency of the VCO clock signal by N to generate the feedback clock signal FB for the PFD 205, as previously discussed. Thus, in operational mode, the PLL 200 frequency and phase lock the VCO clock signal with the reference clock signal (REF) via the feedback clock signal FB.

As discussed, the PLL 200 further includes the calibration circuit 240 and associated components to operate in calibration mode for initially calibrating the frequency of the VCO clock signal. In calibration mode, the frequency of the VCO clock signal is calibrated to within a certain percentage of a target frequency. In this regard, the calibration enable (CAL_EN) is asserted and the SPDT switch 236 routes the VCO clock signal to the divide-by-M divider 234, which divides the frequency of the VCO clock signal by M to generate a calibration feedback clock signal (CLK_FB).

The counter 242 of the calibration circuit 240 is configured to receive the calibration feedback clock signal (CAL_FB). The counter 244 is configured to receive the reference clock signal (REF). The counters 242 and 244 generate counts based on the frequencies of the calibration feedback clock signal (CAL_FB) and the reference clock signal (REF), respectively.

The digital comparator 242 compares the respective counts from the counters 242 and 244, and generates a FAST or SLOW signal depending on which count is higher. For example, if the count from counter 242 is less than the count from counter 244, the digital comparator 246 asserts the SLOW signal (and keeps the FAST signal deasserted) to indicate that the frequency of the calibration feedback clock signal (CAL_FB) is less than the frequency of the reference clock signal (REF). If, on the other hand, the count from counter 242 is greater than the count from counter 244, the digital comparator 246 asserts the FAST signal (and keeps the SLOW signal deasserted) to indicate that the frequency of the calibration feedback clock signal (CAL_FB) is greater than the frequency of the reference clock signal (REF).

Based on the FAST and SLOW signal, the capacitor bank control 248 generates a control signal C for the programmable capacitor bank 250. If, for example, the SLOW signal is asserted, the capacitor bank control 248 generates the control signal C to add one or more binary-weighted capacitors $2^0$ to $2^C$ between the $V_{DD}$ voltage rail and the VCO 220 to increase a coarse frequency control voltage applied to the VCO 220 so that it increases the frequency of the VCO clock signal. If, on the other hand, the FAST signal is asserted, the capacitor bank control 248 generates the control signal C to remove one or more of the binary-weighted capacitors $2^0$ to $2^C$ between the $V_{DD}$ voltage rail and the VCO 220 to decrease the coarse frequency control voltage applied to the VCO 220 so that it decreases the frequency of the VCO clock signal.

Figure 3:
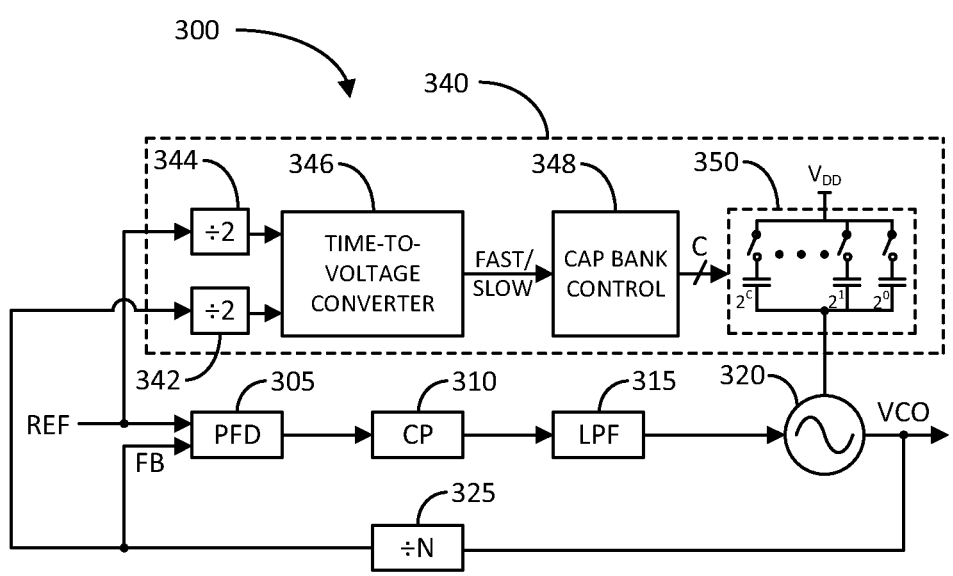
FIG. 3 illustrates a block diagram of another exemplary phase lock loop (PLL) in accordance with another aspect of the disclosure.

FIG. 3 illustrates a block diagram of another exemplary PLL 300 in accordance with another aspect of the disclosure. Similar to PLL 200, the PLL 300 includes a calibration circuit for generating a coarse frequency adjustment signal.

In particular, the PLL 300 includes a phase-frequency detector (PFD) 305, a charge pump (CP) 310, a low pass filter (LPF) 315, a voltage-controlled oscillator (VCO) 320, and a divide-by-N frequency divider 325. In operational mode, the aforementioned devices operate to cause the VCO to generate a VCO clock signal that is frequency and phase locked with a reference clock signal (REF) via a feedback clock signal (FB).

The PLL 300 further includes a calibration circuit 340 with divide-by-two frequency dividers 342 and 344, a time-to-voltage converter 346, a capacitor bank control 348, and a programmable capacitor bank 350. The frequency dividers 342 and 344 are configured to receive the feedback clock signal (FB) from the divide-by-N frequency divider 325 and the reference clock signal (REF), and frequency divide these clock signals by two, respectively.

The time-to-voltage converter 346 is configured to generate a FAST/SLOW signal indicative of a frequency difference between the feedback clock signal (FB) and the reference clock signal (REF). The capacitor bank control 348 is configured to generate a control signal C for the programmable capacitor bank 350 based on the FAST/SLOW signal. If, for example, the FAST/SLOW signal indicates that the frequency of the feedback clock signal (FB) is less than the frequency of the reference clock signal (REF), the capacitor bank control 348 generates the control signal C to add one or more binary-weighted capacitors $2^0$ to $2^C$ between the $V_{DD}$ voltage rail and the VCO 320 to increase a coarse frequency control voltage applied to the VCO 320 so that it increases the frequency of the VCO clock signal. If, on the other hand, the FAST/SLOW signal indicates that the frequency of the feedback clock signal (FB) is greater than the frequency of the reference clock signal (REF), the capacitor bank control 348 generates the control signal C to remove one or more binary-weighted capacitors $2^0$ to $2^C$ between the $V_{DD}$ voltage rail and the VCO 320 to decrease the coarse frequency control voltage applied to the VCO 320 so that it decreases the frequency of the VCO clock signal.

There are several drawbacks with PLLs 200 and 300. First, a separate calibration circuit is required to perform the coarse frequency calibration of the VCO. As illustrated, the separate calibration circuit includes substantial circuitry (e.g., counters, time-to-voltage converters, capacitor bank control, and capacitor bank), which require substantial amount of IC footprint to implement. Second, because the separate calibration circuit requires substantial circuitry, it consumes substantial amount of power to perform the coarse frequency calibration. Third, to achieve an accurate coarse frequency calibration (e.g., to within one percent (1%) of a target frequency), the integration time to generate the accurate coarse frequency calibration signal may be undesirably long. On the other hand, a short integration time leads to significant frequency error (e.g., >1%).

Thus, there is a need for a PLL that is capable of calibrating the frequency of the VCO clock signal without requiring significant additional circuitry for performing the frequency calibration so as to save IC area and power, reduce the time required to complete the VCO frequency calibration, and provide higher resolution frequency calibration.

In summary, a concept described herein is to add a device (referred to herein as a "selection mode device") in front of a phase detector that facilitates the separate measurements of the frequencies of the reference clock signal (REF) and the feedback clock signal (FB) for calibration purposes using existing PLL components.

The selection mode device has three modes: (1) an operational or PLL mode where the device passes the reference clock signal (REF) and the feedback clock signal (FB) to a phase detector for normal PLL operations; (2) a reference clock signal (REF) frequency measurement mode, where the device outputs "early" and "late" signals based solely on the feedback clock signal (FB), which allows a time-to-digital converter (TDC) of the PLL to output a code indicative of the frequency of the reference clock signal (REF); and (3) a feedback clock signal (FB) frequency measurement mode, where the device outputs "early" and "late" signals based solely on the feedback clock signal (FB), which allows the TDC to output a code indicative of the frequency of the feedback clock signal (FB).

A controller is provided that sets the mode of the selection mode device and uses frequency measurements of the reference clock signal (REF) and the feedback clock signal (FB) to provide coarse frequency calibration of the VCO clock signal, and perform phase/frequency control of the VCO clock signal so that it is phase and frequency locked with the reference clock signal (REF). This is explained below with reference to the following exemplary embodiments.

Figure 4:
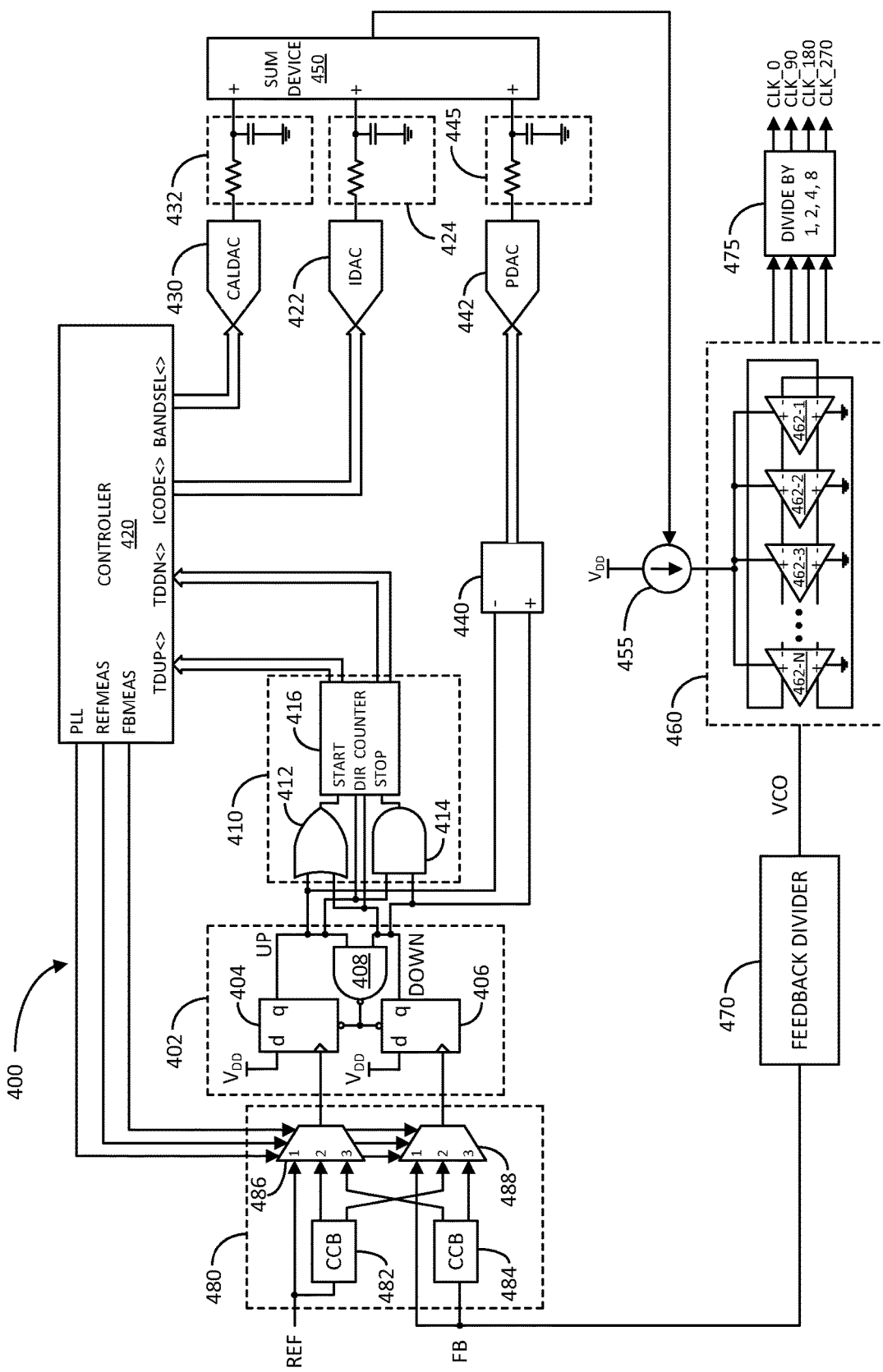
FIG. 4 illustrates a block diagram of another exemplary phase lock loop (PLL) in accordance with another aspect of the disclosure.

FIG. 4 illustrates a block diagram of an exemplary phase locked loop (PLL) 400 in accordance with another aspect of the disclosure. The PLL 400 includes a phase detector 402 (also known as a "phase-frequency detector"), a time-to-digital converter (TDC) 410, a controller 420, a "calibration" digital-to-analog converter (CALDAC) 430, a "calibration" analog low pass filter (LPF) 432, an "integrator" DAC (IDAC) 422, an "integrator" analog LPF 424, a differential device 440, a "proportional" DAC (PDAC) 442, a "proportional" LPF 445, an analog summing device 450, a controllable current source 455, a ring oscillator 460, and a feedback divider 470. The PLL 400 may include a frequency divider bank 475 for performing various frequency divisions (e.g., divide by 1, 2, 4, and 8) of a VCO clock signal generated by the ring oscillator 460 for generating a set of clock signals CLK_0, CLK_90, CLK_180, and CLK_270, respectively.

The phase detector 402, in turn, includes a first flip-flop 404, a second flip-flip 406, and a NAND gate 408 in the same configuration as phase detector 102 previously discussed in detail. Similarly, the TDC 410 includes an OR gate 412, AND gate 414, and counter 416 in the same configuration as the TDC 110 previously discussed in detail. The coupling of the phase detector 402 to the TDC 410 is in the same configuration as the coupling of the phase detector 102 to the TDC 110 previously discussed in detail. Additionally, the ring oscillator 460 includes a set of N cascaded inverters 462-1 to 462-N in the same configuration as ring oscillator 160 previously discussed in detail.

As discussed above, the PLL 400 further includes a selection mode device 480, which includes a first clock conditioning circuit or block (CCB) 482 associated with the reference clock signal (REF), a second CCB 484 associated with the feedback clock signal (FB), a first multiplexer 486, and a second multiplexer 488.

The reference clock signal (REF) is applied to a first input of the first multiplexer 486 and an input of the first CCB 482. The feedback clock signal (FB) is applied to a first input of the second multiplexer 488 and an input of the second CCB 484. The first CCB 482 includes an "early" signal output coupled to a second input of the first multiplexer 486. The first CCB 482 includes a "late" signal output coupled to a second input of the second multiplexer 488. Similarly, the second CCB 484 includes an "early" signal output coupled to a third input of the first multiplexer 486. The second CCB 485 includes a "late" signal output coupled to a third input of the second multiplexer 488.

The controller 420 includes inputs for receiving the TDUP< > and TDDN< > signals from the TDC 410. The controller 420 includes outputs for generating the BANDSEL< > and ICODE< > signals for the CALDAC 430 and the IDAC 422, respectively. The controller 420 further includes outputs for generating select mode signals PLL, RFMEAS, and FBMEAS for first and second multiplexers 486 and 488 of the selection mode device 480.

The selection mode device operates as follows: If the RFMEAS select mode signal generated by the controller 420 is asserted (and the PLL and FBMEAS mode signals are not asserted), the first and second multiplexers 486 and 488 select their respective second inputs to output the "early" and "late" signals from the first CCB 482, respectively. The "early" and "late" signals include consecutive rising edges that are spaced apart in time by substantially one period of the reference clock signal (REF). In response to the "early" and "late" signals being applied to the respective clock inputs of the first and second flip-flops 404 and 406 of the phase detector 402, the phase detector 402 generates asserted UP and DOWN signals that are also spaced apart in time by substantially one period of the reference clock signal (REF). In response to the UP and DOWN signals, the TDC 410 generates the TDUP< > signal with a resulting code indicative of the frequency of the reference clock signal (REF).

Similarly, if the FBMEAS select mode signal generated by the controller 420 is asserted (and the PLL and REFMEAS mode signals are not asserted), the first and second multiplexers 486 and 488 select their respective third inputs to output the "early" and "late" signals from the second CCB 484, respectively. The "early" and "late" signals include consecutive rising edges that are spaced apart in time by substantially one period of the feedback clock signal (FB). In response to the "early" and "late" signals being applied to the respective clock inputs of the first and second flip-flops 404 and 406 of the phase detector 402, the phase detector 402 generates asserted UP and DOWN signals that are also spaced apart in time by substantially one period of the feedback clock signal (FB). In response to the UP and DOWN signals, the TDC 410 generates the TDUP< > signal with a resulting code indicative of the frequency of the feedback clock signal (FB).

If the PLL select mode signal generated by the controller 420 is asserted (and the REFMEAS and FBMEAS mode signals are not asserted), the first and second multiplexers 486 and 488 select their respective first inputs to output the reference clock signal (REF) and feedback clock signal (FB), respectively. Accordingly, in this mode, the reference clock signal (REF) and feedback clock signal (FB) are applied to the clock inputs of the first and second flip-flops 404 and 406 of the phase detector 402 to perform normal PLL operations as discussed in detail with respect to PLL 100. However, in this case, the controller 420 performs the operation of the digital loop filter 120 for integrating the TDUP< > and TDDN< > signals from the TDC 410 for generating the frequency control signal ICODE< > to phase and frequency lock the VCO clock signal to the reference clock signal (REF).

Figure 5A:
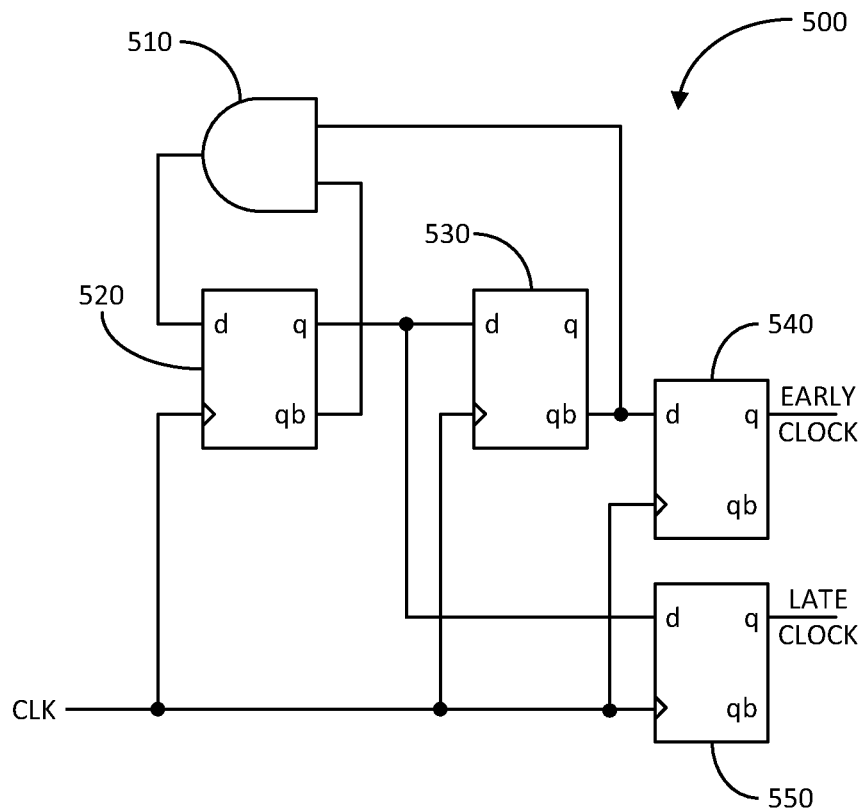
FIG. 5A illustrates a schematic diagram of an exemplary selection mode device in accordance with another aspect of the disclosure.

FIG. 5A illustrates a schematic diagram of an exemplary CCB 500 in accordance with another aspect of the disclosure. The CCB 500 may be an exemplary detailed implementation of any of the CCBs 482 and 484 previously discussed. In particular, the CCB 500 includes a divide-by-three component including an AND gate 510, and flip-flops 520 and 530. The CCB 500 further includes an "early" output data flip-flop 540 and a "late" output data flip-flop 550.

The flip-flops 520, 530, 540, and 550 of the CCB 500 each include a clock input configured to receive a clock signal CLK. In the case of CCB 482, the clock signal CLK is the reference clock signal (REF). In the case of CCB 484, the clock signal CLK is the feedback clock signal (FB).

The inputs of the AND gate 510 are coupled to the complementary outputs (qb) of flip-flops 520 and 530. The output of the AND gate 510 is coupled to the data input (d) of the flip-flop 520. The output (q) of the flip-flop 520 is coupled to the data inputs (d) of the flip-flop 530 and the "late" output flip-flop 550. The complementary output (qb) of the flip-flop 530 is coupled to the data input (d) of the "early" output flip-flop 540. The output (q) of the "early" output flip-flop 540 is configured to generate the "early" signal, and the output (q) of the "late" output flip-flop 550 is configured to generate the "late" signal.

Figure 5B:
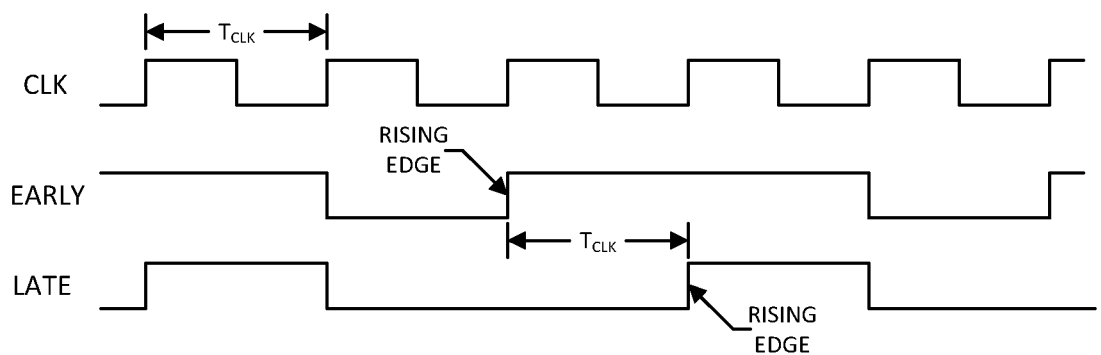
FIG. 5B illustrates a timing diagram of signals related to the operation of the selection mode device in accordance with another aspect of the disclosure.

FIG. 5B illustrates a timing diagram of the clock signal CLK, the "early" signal, and the "late" signal in accordance with another aspect of the disclosure. Because of the divide-by-three component of the CCB 500, the frequency of the "early" and "late" signals is ⅓ the frequency of the input clock signal CLK. However, the duty cycle of the "early" signal is ⅔ and the duty cycle of the "late" signal is ⅓.

As indicated near the middle of the timing diagram, the "early" signal has a rising edge that coincides with a first rising edge of the input clock signal CLK. Similarly, the "late" signal has a rising edge that coincides with a second (next) rising edge of the input clock signal CLK. The time difference between the consecutive rising edges of the "early" and "late" signals are spaced apart in time by substantially one period $T_{CLK}$ of the input clock signal CLK.

With reference again to FIG. 4, the "early" and "late" signals from the CCB 482 or 484 are applied to the TDC 410 via the first and second multiplexers 486 and 488 and phase detector 402, respectively. The rising edge of the "early" signal initiates the counting operation of the TDC 410 via the UP signal and the rising edge of the "late" signal stops the counting operation of the TDC 410 via the DOWN signal. Thus, the TDC 410 generates a code indicative of the period or frequency of the corresponding clock signal.

The coarse calibration of the frequency of the VCO 460 operates as follows: The controller 420 asserts the REFMEAS signal to cause the first and second multiplexers 486 and 488 to output the "early" and "late" signals generated by the CCB 482 associated with the reference clock signal (REF). Based on the "early" and "late" signals, the TDC 410 generates TDUP< > with a first code indicative of the frequency of the reference clock signal (REF).

The controller 420 then asserts the FBMEAS signal to cause the first and second multiplexers 490 and 495 to output the "early" and "late" signals generated by the CCB 484 associated with the feedback clock signal (FB). Based on the "early" and "late" signals, the TDC 410 generates TDUP< > with a second code indicative of the frequency of the feedback clock signal (FB). The controller 420 continues to measure the frequency of the feedback clock signal (FB) and adjusts the BANDSEL< > signal as needed to bring the frequency of the feedback clock signal (FB) to substantially the frequency of the reference clock signal (REF) based on the resolution of the BANDSEL< > and TDUP< > signals.

Once the coarse calibration of the frequency of the VCO 460 is complete, the controller 420 asserts the PLL signal so that the first and second multiplexers 486 and 488 output the reference clock signal (REF) and feedback clock signal (FB), respectively. This configures the PLL 400 in operational mode so that the VCO clock signal tracks the frequency and phase of the reference clock signal (REF) similar to the phase/frequency locking operation of PLL 100 (with the exception that the controller 420 performs the digital loop filter operation as discussed).

Figure 6:
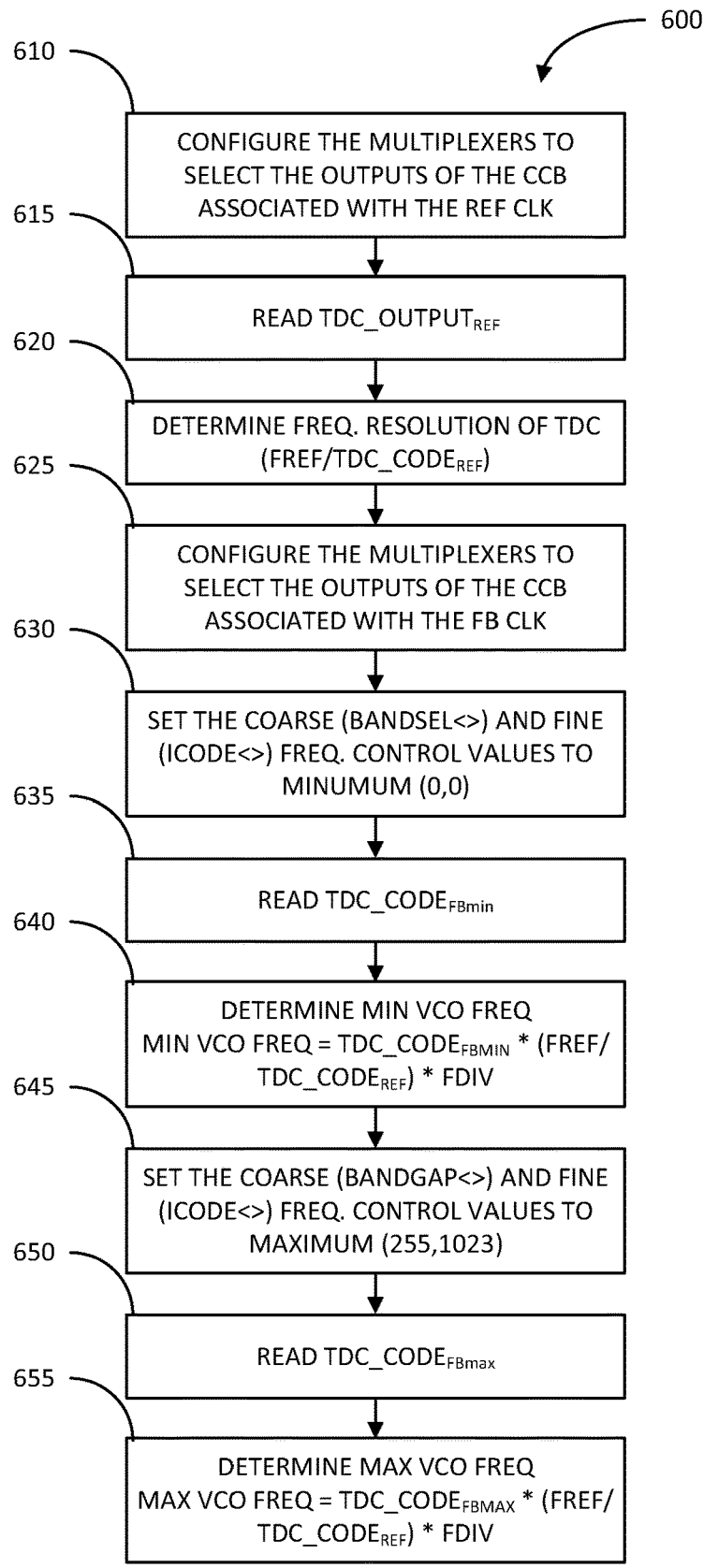
FIG. 6 illustrates a flow diagram of an exemplary method of determining a tunable frequency range of a voltage controlled oscillator (VCO) in accordance with another aspect of the disclosure.

FIG. 6 illustrates a flow diagram of an exemplary method 600 of determining a tunable frequency range of a VCO clock signal in accordance with another aspect of the disclosure.

The method 600 includes the controller 420 asserting the REFMEAS signal to cause the multiplexers 486 and 488 to output the "early" and "late" signals associated with the reference clock signal (REF), respectively (block 610). The method 600 further includes the controller 420 reading the output code (TDC_CODE$_{REF}$) of the TDUP< > signal from the TDC 410 (block 615). The controller 420 then determines the frequency resolution of the TDC 410 (block 620). The frequency resolution of the TDC 410 may be given by the following relationship $f_{REF}$/TDC_CODE$_{REF}$, where $f_{REF}$ is the known frequency of the reference clock signal (REF).

The method 600 further includes the controller 420 asserting the FBMEAS signal to cause the multiplexers 490 and 495 to output the "early" and "late" signals associated with the feedback clock signal (FB), respectively (block 625). The method 600 further includes the controller 420 setting the coarse frequency control signal BANDSET< > and the fine frequency control signal ICODE< > to minimum values (0,0) (block 630). The method 600 additionally includes the controller 420 reading the output code (TDC_CODE$_{FBMIN}$) of the TDC 410 (block 635). The controller 420 then determines the minimum VCO frequency (block 640). The minimum VCO frequency may be given by the following relationship:

MIN VCO FREQ=TDC_CODE$_{FBMIN}$*($f_{REF}$/TDC_CODE$_{REF}$)*FDIV, where FDIV is the frequency divisor of the feedback divider 470.

The method 600 further includes the controller 420 setting the coarse frequency control signal BANDSET< > and the fine frequency control signal ICODE< > to maximum values (e.g., 255, 1023) (block 645). The method 600 additionally includes the controller 420 reading the output code (TDC_CODE$_{FBMAX}$) of the TDC 410 (block 650). The controller 420 then determines the maximum VCO frequency (block 655). The maximum VCO frequency may be given by the following relationship:

MAX VCO FREQ=TDC_CODE$_{FBMAX}$*(FREF/TDC_CODE$_{REF}$)*FDIV

Accordingly, the tunable frequency range of the VCO may be given by the following relationship:

TUNABLE FREQ RANGE=MAX VCO FREQ−MIN VCO FREQ

Figure 7:
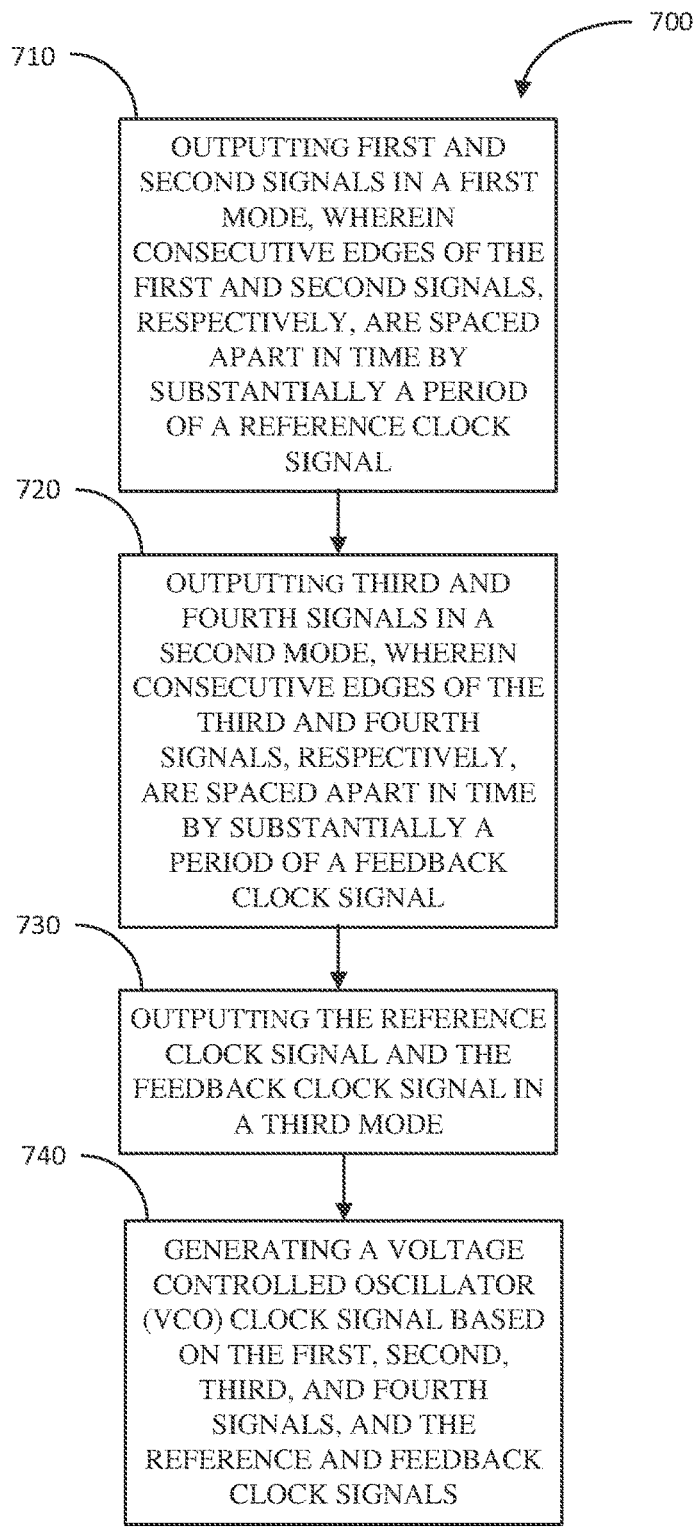
FIG. 7 illustrates a flow diagram of another exemplary method of generating a voltage controlled oscillator (VCO) clock signal in accordance with another aspect of the disclosure.

FIG. 7 illustrates a flow diagram of another exemplary method 700 of generating a voltage controlled oscillator (VCO) clock signal in accordance with another aspect of the disclosure.

The method 700 includes outputting first and second signals in a first mode, wherein consecutive edges of the first and second signals, respectively, are spaced apart in time by substantially a period of a reference clock signal (block 710). An example of a means for outputting the first and second signals in the first mode includes the selection mode device 480 configured in the REFMEAS mode.

The method 700 also includes outputting third and fourth signals in a second mode, wherein consecutive edges of the third and fourth signals, respectively, are spaced apart in time by substantially a period of a feedback clock signal (block 720). An example of a means for outputting the third and fourth signals in the second mode includes the selection mode device 480 configured in the FBMEAS mode.

The method 700 further includes outputting the reference clock signal and the feedback clock signal in a third mode (block 730). An example of a means for outputting the reference clock signal and the feedback clock signal in the third mode includes the selection mode device configured in the PLL mode.

Additionally, the method 700 includes generating the VCO clock signal based on the first, second, third, and fourth signals, and the reference and feedback clock signals (block 740). An example of means for generating the VCO clock signal based on the first, second, third, and fourth signals, and the reference and feedback clock signals includes the phase detector 402, TDC 410, controller 420, CALDAC 430, LPF 432, IDAC 422, LPF 424, summing device 450, controllable current source 455, and the ring oscillator 460.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a selection mode device configured to:
      output first and second signals in a first mode, wherein consecutive edges of the first and second signals, respectively, are spaced apart in time by substantially a period of a reference clock signal, the first and second signals used to generate a measurement of a frequency of the reference clock signal;
      output third and fourth signals in a second mode, wherein consecutive edges of the third and fourth signals, respectively, are spaced apart in time by substantially a period of a feedback clock signal, the third and fourth signals used to generate a measurement of a frequency of the feedback clock signal; and
      output the reference clock signal and the feedback clock signal in a third mode signal;
   a phase lock loop (PLL) circuit configured to generate a voltage controlled oscillator (VCO) clock signal based on the measurement of the frequencies of the reference and feedback clock signals.

2. The apparatus of claim 1, wherein the selection mode device comprises a clock conditioning circuit configured to generate the first and second signals based on the reference clock signal.

3. An apparatus, comprising:
   a selection mode device configured to:
      output first and second signals in a first mode, wherein consecutive edges of the first and second signals, respectively, are spaced apart in time by substantially a period of a reference clock signal;
      output third and fourth signals in a second mode, wherein consecutive edges of the third and fourth signals, respectively, are spaced apart in time by substantially a period of a feedback clock signal; and
      output the reference clock signal and the feedback clock signal in a third mode signal, wherein the selection mode device comprises a clock conditioning circuit configured to generate the first and second signals based on the reference clock signal, and wherein the clock conditioning circuit comprises:
      an AND gate;
      a first flip-flip including a first clock input configured to receive the reference clock signal, a first data input coupled to an output of the AND gate, a first data output, and a second data output coupled to a first input of the AND gate;
      a second flip-flop including a second clock input configured to receive the reference clock signal, a second data input coupled to the first data output of the first flip-flop, and a third data output coupled to a second input of the AND gate;
      a third flip-flop including a third clock input configured to receive the reference clock signal, a third data input coupled to the third data output of the second flip-flop, and a fourth data output configured to produce the first signal; and
      a fourth flip-flop including a fourth clock input configured to receive the reference clock signal, a fourth data input coupled to the first data output of the first flip-flop, and a fifth data output configured to produce the second signal; and
   a phase lock loop (PLL) circuit configured to generate a voltage controlled oscillator (VCO) clock signal based on the first, second, third, and fourth signals, and the reference and feedback clock signals.

4. The apparatus of claim 1, wherein the selection mode device comprises a clock conditioning circuit configured to generate the third and fourth signals based on the feedback clock signal.

5. An apparatus, comprising:
   a selection mode device configured to:
      output first and second signals in a first mode, wherein consecutive edges of the first and second signals, respectively, are spaced apart in time by substantially a period of a reference clock signal;
      output third and fourth signals in a second mode, wherein consecutive edges of the third and fourth signals, respectively, are spaced apart in time by substantially a period of a feedback clock signal; and
      output the reference clock signal and the feedback clock signal in a third mode signal, wherein the selection mode device comprises a clock conditioning circuit configured to generate the third and fourth signals based on the feedback clock signal, and wherein the clock conditioning circuit comprises:
      an AND gate;
      a first flip-flip including a first clock input configured to receive the feedback clock signal, a first data input coupled to an output of the AND gate, a first data output, and a second data output coupled to a first input of the AND gate;
      a second flip-flop including a second clock input configured to receive the feedback clock signal, a second data input coupled to the first data output of the first flip-flop, and a third data output coupled to a second input of the AND gate;
      a third flip-flop including a third clock input configured to receive the feedback clock signal, a third data input coupled to the third data output of the second flip-flop, and a fourth data output configured to produce the third signal; and
      a fourth flip-flop including a fourth clock input configured to receive the feedback clock signal, a fourth data input coupled to the first data output of the first flip-flop, and a fifth data output configured to produce the fourth signal; and a phase lock loop (PLL) circuit configured to generate a voltage controlled oscillator (VCO) clock signal based on the first, second, third, and fourth signals, and the reference and feedback clock signals.

6. The apparatus of claim 1, wherein the selection mode device comprises:
a first clock conditioning circuit configured to generate the first and second signals based on the reference clock signal;
a second clock conditioning circuit configured to generate the third and fourth signals based on the feedback clock signal;
a first multiplexer configured to:
output the first signal in response to a first mode signal indicating the first mode;
output the third signal in response to a second mode signal indicating the second mode; and
output the reference clock signal in response to a third mode signal indicating the third mode; and
a second multiplexer configured to:
output the second signal in response to the first mode signal;
output the fourth signal in response to the second mode signal; and
output the feedback clock signal in response to the third mode signal.

7. The apparatus of claim 1, wherein the PLL circuit comprises:
a voltage controlled oscillator (VCO) configured to generate the VCO clock signal; and
a controller configured to:
generate the measurement of the frequency of the reference clock signal based on the first and second signals;
generate the measurement of the frequency of the feedback clock signal based on the third and fourth signals; and
generate a first frequency control signal for the VCO based on the measurement of the frequencies of the reference and feedback clock signals.

8. The apparatus of claim 7, wherein the controller is further configured to generate a second frequency control signal for the VCO based on a comparison of a phase of the feedback clock signal with a phase of the reference clock signal.

9. The apparatus of claim 8, wherein the controller is further configured to:
generate a first mode signal indicative of the first mode to initiate the measurement of the frequency of the reference clock signal based on the first and second signals;
generate a second control signal indicative of the second mode to initiate the measurement of the frequency of the feedback clock signal based on the third and fourth signals; and
generate the third mode signal indicative of the third mode to initiate the generation of the second frequency control signal.

10. The apparatus of claim 1, wherein the PLL circuit comprises a phase detector configured to:
assert first and second control signals in response to the consecutive edges of the first and second signals, respectively;
assert third and fourth control signals in response to the consecutive edges of the third and fourth signals, respectively; and assert fifth and sixth control signals in response to leading and trailing consecutive edges of the reference and feedback clock signals or the feedback and reference clock signals, respectively.

11. The apparatus of claim 10, wherein the phase detector comprises:
a first flip-flop comprising:
a first clock input configured to:
receive the first signal in the first mode;
receive the third signal in the second mode; and
receive the reference clock signal in the third mode;
a first data input configured to receive a supply voltage;
a first data output configured to generate first, third, and fifth control signals in the first, second, and third modes, respectively; and
a first reset input configured to receive a reset signal to cause the first flip-flop to deassert the first, third, and fifth control signals in the first, second, and third modes, respectively;
a second flip-flop comprising:
a second clock input configured to:
receive the second signal in the first mode;
receive the fourth signal in the second mode; and
receive the feedback clock signal in the third mode;
a second data input configured to receive the supply voltage;
a second data output configured to generate second, fourth, and sixth control signals in the first, second, and third modes, respectively; and
a second reset input configured to receive the reset signal to cause the second flip-flop to deassert the second, fourth, and sixth control signals in the first, second, and third modes, respectively; and
a NAND gate including inputs coupled to the first and second data outputs of the first and second flip-flops, and an output configured to generate the reset signal.

12. The apparatus of claim 10, wherein the PLL circuit further comprises a time-to-digital converter configured to:
initiate a counter to periodically increment a count in response to the asserted first, third, and fifth signals in the first, second, and third modes, respectively;
stop the counter from periodically incrementing the count in response to the asserted second, fourth, and sixth signals in the first, second, and third modes, respectively;
wherein the count after the counter has stopped incrementing the count is indicative of the frequency of the reference clock signal in the first mode, the frequency of the feedback clock signal in the second mode, and a phase difference between the feedback clock signal and the reference clock signal in the third mode.

13. The apparatus of claim 12, wherein the PLL circuit further comprises:
a voltage controlled oscillator (VCO) configured to generate the VCO clock signal, wherein the feedback clock signal is based on the VCO clock signal; and
a controller configured to generate a first frequency control signal for the VCO to cause the count in the second mode to be substantially equal to the count in the first mode based on a resolution the first frequency control signal.

14. The apparatus of claim 13, wherein the controller is configured to generate a second frequency control signal for the VCO to cause the count in the third mode to be substantially equal to zero based on a resolution of the second frequency control signal.

15. The apparatus of claim 1, wherein the PLL circuit comprises:
a voltage controlled oscillator (VCO) configured to generate the VCO clock signal, wherein the feedback clock signal is based on the VCO clock signal; and
a controller configured to:
configure a frequency control signal to cause the VCO to generate the VCO clock signal with a minimum frequency;
measure a first frequency of the feedback clock signal based on the first and second signals when the VCO clock signal is at the minimum frequency;
configure the frequency control signal to cause the VCO to generate the VCO clock signal with a maximum frequency;
measure a second frequency of the feedback clock signal based on the first and second signals when the VCO clock signal is at the maximum frequency; and
determine a tunable frequency range of the VCO clock signal based on the first and second frequencies.

16. A method, comprising:
outputting first and second signals in a first mode, wherein consecutive edges of the first and second signals, respectively, are spaced apart in time by substantially a period of a reference clock signal;
measuring a frequency of the reference clock signal based on the first and second signals;
outputting third and fourth signals in a second mode, wherein consecutive edges of the third and fourth signals, respectively, are spaced apart in time by substantially a period of a feedback clock signal;
measuring a frequency of the feedback clock signal based on the third and fourth signals;
outputting the reference clock signal and the feedback clock signal in a third mode; and
generating a voltage controlled oscillator (VCO) clock signal based on the measurement of the frequencies of the reference and feedback clock signals.

17. The method of claim 16, wherein generating the VCO clock signal further comprises controlling the frequency of the VCO clock signal based on a comparison of a phase of the feedback clock signal with a phase of the reference clock signal.

18. The method of claim 17, further comprising:
generating a first mode signal indicative of the first mode to initiate the measurement of the frequency of the reference clock signal based on the first and second signals;
generating a second control signal indicative of the second mode to initiate measurement of the frequency of the feedback clock signal based on the third and fourth signals; and
generating the third mode signal indicative of the third mode to initiate the controlling of the frequency of the VCO clock signal based on the comparison of the phase of the feedback clock signal with the phase of the reference clock signal.

19. The method of claim 16, further comprising:
asserting first and second control signals in response to the consecutive edges of the first and second signals, respectively;
initiating a counter to periodically increment a count in response to the asserted first control signal;
stopping the counter from periodically incrementing the count in response to the asserted second control signal, wherein a value of the count after the counter has stopped incrementing the count is indicative of the frequency of the reference clock signal; and
controlling a frequency of the VCO clock signal based on the value of the count.

20. The method of claim 16, further comprising:
asserting first and second control signals in response to the consecutive edges of the third and fourth signals, respectively;
initiating a counter to periodically increment a count in response to the asserted first control signal;
stopping the counter from periodically incrementing the count in response to the asserted second control signal, wherein a value of the count after the counter has stopped incrementing the count is indicative of the frequency of the feedback clock signal; and
controlling a frequency of the VCO clock signal based on the value of the count.

21. The method of claim 16, further comprising:
setting a frequency control signal for controlling a frequency of the VCO clock signal to a minimum value;
measuring a first frequency of the feed feedback clock signal based on the first and second signals when the frequency control signal is at the first value;
setting the frequency control signal to a maximum value;
measuring a second frequency of the feed feedback clock signal based on the first and second signals when the frequency control signal is at the second value; and
determining a tunable frequency range of the VCO clock signal based on the first and second frequencies.

22. An apparatus, comprising:
means for outputting first and second signals in a first mode, wherein consecutive edges of the first and second signals, respectively, are spaced apart in time by substantially a period of a reference clock signal;
means for measuring a frequency of the reference clock signal based on the first and second signals;
means for outputting third and fourth signals in a second mode, wherein consecutive edges of the third and fourth signals, respectively, are spaced apart in time by substantially a period of a feedback clock signal;
means for measuring a frequency of the feedback clock signal based on the third and fourth signals;
means for outputting the reference clock signal and the feedback clock signal in a third mode; and
means for generating a voltage controlled oscillator (VCO) clock signal based on the measurement of the frequencies of the reference and feedback clock signals.

23. The apparatus of claim 22, wherein the means for generating the VCO clock signal further comprises means for controlling the frequency of the VCO clock signal based on a comparison of a phase of the feedback clock signal with a phase of the reference clock signal.

24. The apparatus of claim 23, further comprising:
means for generating a first mode signal indicative of the first mode to initiate the measurement of the frequency of the reference clock signal based on the first and second signals;
means for generating a second control signal indicative of the second mode to initiate measurement of the frequency of the feedback clock signal based on the third and fourth signals; and
means for generating the third mode signal indicative of the third mode to initiate the controlling of the frequency of the VCO clock signal based on the comparison of the phase of the feedback clock signal with the phase of the reference clock signal.

25. The apparatus of claim 22, further comprising:

means for asserting first and second control signals in response to the consecutive edges of the first and second signals, respectively;

means for initiating a counter to periodically increment a count in response to the asserted first control signal;

means for stopping the counter from periodically incrementing the count in response to the asserted second control signal, wherein a value of the count after the counter has stopped incrementing the count is indicative of the frequency of the reference clock signal; and means for controlling a frequency of the VCO clock signal based on the value of the count.

26. The apparatus of claim 22, further comprising:

means for asserting first and second control signals in response to the consecutive edges of the third and fourth signals, respectively;

means for initiating a counter to periodically increment a count in response to the asserted first control signal;

means for stopping the counter from periodically incrementing the count in response to the asserted second control signal, wherein a value of the count after the counter has stopped incrementing the count is indicative of the frequency of the feedback clock signal; and means for controlling a frequency of the VCO clock signal based on the value of the count.

27. The apparatus of claim 22, further comprising:

means for setting a frequency control signal for controlling a frequency of the VCO clock signal to a minimum value;

means for measuring a first frequency of the feed feedback clock signal based on the first and second signals when the frequency control signal is at the first value;

means for setting the frequency control signal to a maximum value;

means for measuring a second frequency of the feed feedback clock signal based on the first and second signals when the frequency control signal is at the second value; and means for determining a tunable frequency range of the VCO clock signal based on the first and second frequencies.

* * * * *